United States Patent
Lee et al.

(10) Patent No.: US 9,859,526 B2
(45) Date of Patent: Jan. 2, 2018

(54) FLEXIBLE DISPLAY DEVICE

(71) Applicant: SAMSUNG DISPLAY CO., LTD., Yongin-si, Gyeonggi-do (KR)

(72) Inventors: Byoungduk Lee, Yongin-si (KR); Eungseok Park, Yongin-si (KR); Wonmin Yun, Yongin-si (KR); Yunah Chung, Yongin-si (KR); Yoonhyeung Cho, Yongin-si (KR); Yongchan Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/945,333

(22) Filed: Nov. 18, 2015

(65) Prior Publication Data

US 2016/0233453 A1 Aug. 11, 2016

(30) Foreign Application Priority Data

Feb. 11, 2015 (KR) ........................ 10-2015-0020964

(51) Int. Cl.
*H01L 51/52* (2006.01)
*H01L 27/32* (2006.01)
*H01L 51/00* (2006.01)

(52) U.S. Cl.
CPC ...... *H01L 51/5256* (2013.01); *H01L 27/3225* (2013.01); *H01L 27/3244* (2013.01);
(Continued)

(58) Field of Classification Search
CPC ............. H01L 51/5256; H01L 51/5253; H01L 51/0097; H01L 27/3225; H01L 27/3244; H01L 2251/5338
(Continued)

(56) References Cited

U.S. PATENT DOCUMENTS 6,790,526 B2    9/2004   Vargo et al.
7,129,102 B2   10/2006   Yamazaki
(Continued)

FOREIGN PATENT DOCUMENTS

JP    2001-255514 A    9/2001
KR    2003-0004128 A    1/2003
(Continued)

OTHER PUBLICATIONS

Machine translation, Ueda, Japanese Pat. Pub. No. JP 2001-255514, translation date: Nov. 10, 2016, Espacenet, all pages.*
(Continued)

*Primary Examiner* — Victoria K Hall
(74) *Attorney, Agent, or Firm* — Lewis Roca Rothgerber Christie LLP

(57) ABSTRACT

A flexible display device includes: a flexible substrate; a display unit on the flexible substrate and including a display area capable of displaying an image; and a thin film encapsulating layer encapsulating the display unit and including at least one inorganic encapsulating film and at least one organic encapsulating film, where the organic encapsulating film includes at least one first organic region including a first organic material and at least one second organic region including a second organic material that is different from the first organic material, and the at least one first organic region extends in a first direction, the at least one first organic region and the at least one second organic region are aligned with each other, and a first Young's modulus of the at least one first organic region is different from a second Young's modulus of the least one second organic region.

20 Claims, 4 Drawing Sheets

(52) U.S. Cl.
CPC ...... *H01L 51/0097* (2013.01); *H01L 51/5253* (2013.01); *H01L 2251/5338* (2013.01); *Y02E 10/549* (2013.01)

(58) Field of Classification Search
USPC .......................................................... 428/12
See application file for complete search history.

(56) References Cited

U.S. PATENT DOCUMENTS

| | | | |
|---|---|---|---|
| 9,525,012 B2* | 12/2016 | Lim | H01L 27/3244 |
| 9,637,665 B2* | 5/2017 | Shim | C09J 7/00 |
| 9,651,998 B2* | 5/2017 | Matsueda | G06F 1/1652 |
| 9,670,713 B2* | 6/2017 | Veerasamy | E06B 3/673 |
| 9,719,665 B2* | 8/2017 | Hirakata | F21V 15/012 |
| 2003/0027369 A1 | 2/2003 | Yamazaki | |
| 2004/0234813 A1 | 11/2004 | Lee et al. | |
| 2006/0214008 A1 | 9/2006 | Asami et al. | |
| 2008/0055831 A1 | 3/2008 | Satoh | |
| 2008/0180022 A1* | 7/2008 | Kwack | B82Y 20/00 313/504 |
| 2009/0135550 A1* | 5/2009 | Umemoto | H01G 9/15 361/523 |
| 2010/0308335 A1 | 12/2010 | Kim et al. | |
| 2011/0134144 A1* | 6/2011 | Moriwaki | G09G 3/3208 345/660 |
| 2012/0147599 A1 | 6/2012 | Shim et al. | |
| 2012/0154707 A1* | 6/2012 | Hsieh | H01L 51/0097 349/60 |
| 2013/0221840 A1 | 8/2013 | Oh | |
| 2014/0065326 A1* | 3/2014 | Lee | G06F 1/16 428/12 |
| 2014/0131668 A1 | 5/2014 | Kim | |
| 2014/0131682 A1 | 5/2014 | Kim et al. | |
| 2014/0240985 A1 | 8/2014 | Kim et al. | |
| 2014/0295150 A1* | 10/2014 | Bower | C09J 7/02 428/201 |
| 2014/0300529 A1 | 10/2014 | Kim et al. | |
| 2015/0001483 A1 | 1/2015 | Namkung et al. | |
| 2015/0144921 A1 | 5/2015 | Lim et al. | |
| 2015/0179717 A1* | 6/2015 | Kawata | H01L 29/7869 257/43 |
| 2015/0185782 A1 | 7/2015 | Kim et al. | |
| 2016/0007441 A1* | 1/2016 | Matsueda | G06F 1/1652 361/749 |
| 2016/0240817 A1* | 8/2016 | Cho | H01L 51/5256 |
| 2017/0141348 A1* | 5/2017 | Yu | H01L 51/5237 |

FOREIGN PATENT DOCUMENTS

| | | |
|---|---|---|
| KR | 10-2004-0099800 A | 12/2004 |
| KR | 10-2010-0130898 A | 12/2010 |
| KR | 10-2012-0063748 A | 6/2012 |
| KR | 10-2014-0060776 A | 5/2014 |
| KR | 10-2014-0101977 A | 8/2014 |

OTHER PUBLICATIONS

EPO Search Report dated Jun. 27, 2016 for corresponding European Patent application 16155343.3, (7 pages).
U.S. Office Action dated Mar. 2, 2017, issued in cross-reference U.S. Appl. No. 14/849,405 (23 pages).
U.S. Office Action dated Sep. 15, 2016, issued in cross-reference U.S. Appl. No. 14/849,405 (19 pages).

* cited by examiner

FLEXIBLE DISPLAY DEVICE

CROSS-REFERENCE TO RELATED APPLICATION

This application claims priority to and the benefit of Korean Patent Application No. 10-2015-0020964, filed on Feb. 11, 2015, in the Korean Intellectual Property Office, the entire content of which is incorporated herein by reference.

BACKGROUND

1. Field

One or more example embodiments relate to a flexible display device.

2. Description of the Related Art

Recently, along with efforts to provide various forms of electronic devices, research/development has been conducted to provide various forms of displays that are included in the electronic devices.

Meanwhile, organic light-emitting display apparatuses that are self-emitting type (or kind) display apparatuses require no additional light sources, and thus, they may be driven by a low voltage, and may be formed to be thin and light. Also, organic light-emitting display apparatuses have excellent characteristics, such as wide viewing angles, high contrast and rapid response rates. All these features draw attention to the organic light-emitting display apparatuses, as the next generation display apparatus.

SUMMARY

One or more example embodiments include a flexible display device.

Additional aspects will be set forth in part in the description which follows and, in part, will be apparent from the description, or may be learned by practice of the presented embodiments.

According to one or more example embodiments, a flexible display device includes: a flexible substrate; a display unit on the flexible substrate and including a display area capable of displaying an image; and a thin film encapsulating layer encapsulating the display unit and including at least one inorganic encapsulating film and at least one organic encapsulating film, where the organic encapsulating film includes at least one first organic region including a first organic material and at least one second organic region including a second organic material that is different from the first organic material, and the at least one first organic region extends in a first direction, the at least one first organic region and the at least one second organic region are aligned with each other, and a first Young's modulus of the at least one first organic region is different from a second Young's modulus of the least one second organic region.

The first Young's modulus may be smaller than the second Young's modulus, and a ratio of the second Young's modulus to the first Young's modulus may be about $4\times10$ through $2\times10^4$.

The first organic material may include a silicon-based resin, and the second organic material may include at least one selected from an acryl-based resin and an epoxy-based resin.

The flexible display device may include at least one folding region and the at least one folding region may extend along the first direction. The at least one first organic region may overlap the at least one folding region.

A width of the at least one first organic region may be equal to or greater than a width of the at least one folding region.

The at least one first organic region and the at least one second organic region may be alternately arranged, repeatedly, along a second direction that crosses the first direction.

The first direction and the second direction may be perpendicular to each other.

The flexible display device may be windable around an axis parallel to the first direction.

A first elongation percentage of the organic encapsulating film in the first direction may be smaller than a second elongation percentage of the organic encapsulating film in the second direction.

The display unit may include an organic light-emitting device (OLED) and a thin film transistor electrically coupled to the OLED.

The flexible display device may include a plurality of the inorganic encapsulating film and a plurality of the organic encapsulating film, and the inorganic encapsulating films and the organic encapsulating films may be alternately stacked.

According to one or more example embodiments, a flexible display device includes: a display unit including a display area capable of displaying an image; a sensing unit capable of detecting a shape of the flexible display device; and a controller capable of controlling an operation of the display unit, according to the shape detected by the sensing unit, where the display unit is encapsulated by a thin film encapsulating layer including at least one inorganic encapsulating film and at least one organic encapsulating film, the at least one organic encapsulating film includes at least one first organic region and at least one second organic region, side surfaces of the at least one first organic region and the at least one second organic region contact each other, and a first Young's modulus of the at least one first organic region and a second Young's modulus of the at least one second organic region are different from each other.

The at least one first organic region may extend in a first direction, and the first Young's modulus may be smaller than the second Young's modulus.

A ratio of the second Young's modulus to the first Young's modulus may be about $4\times10$ through $2\times10^4$.

The flexible display device may include at least one folding region and the at least one folding region may extend along the first direction. The at least one first organic region may overlap the at least one folding region.

The at least one folding region may be located at the at least one first organic region.

The at least one first organic region and the at least one second organic region may be alternately arranged, repeatedly, along a second direction that is perpendicular to the first direction, and the flexible display device may be windable around an axis parallel to the first direction.

A first elongation percentage of the organic encapsulating film in the first direction may be smaller than a second elongation percentage of the organic encapsulating film in the second direction.

The flexible display device may further include a flexible substrate. The display unit may be located between the flexible substrate and the thin film encapsulating layer.

The display unit may include an organic light-emitting device (OLED) and a thin film transistor electrically coupled to the OLED.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
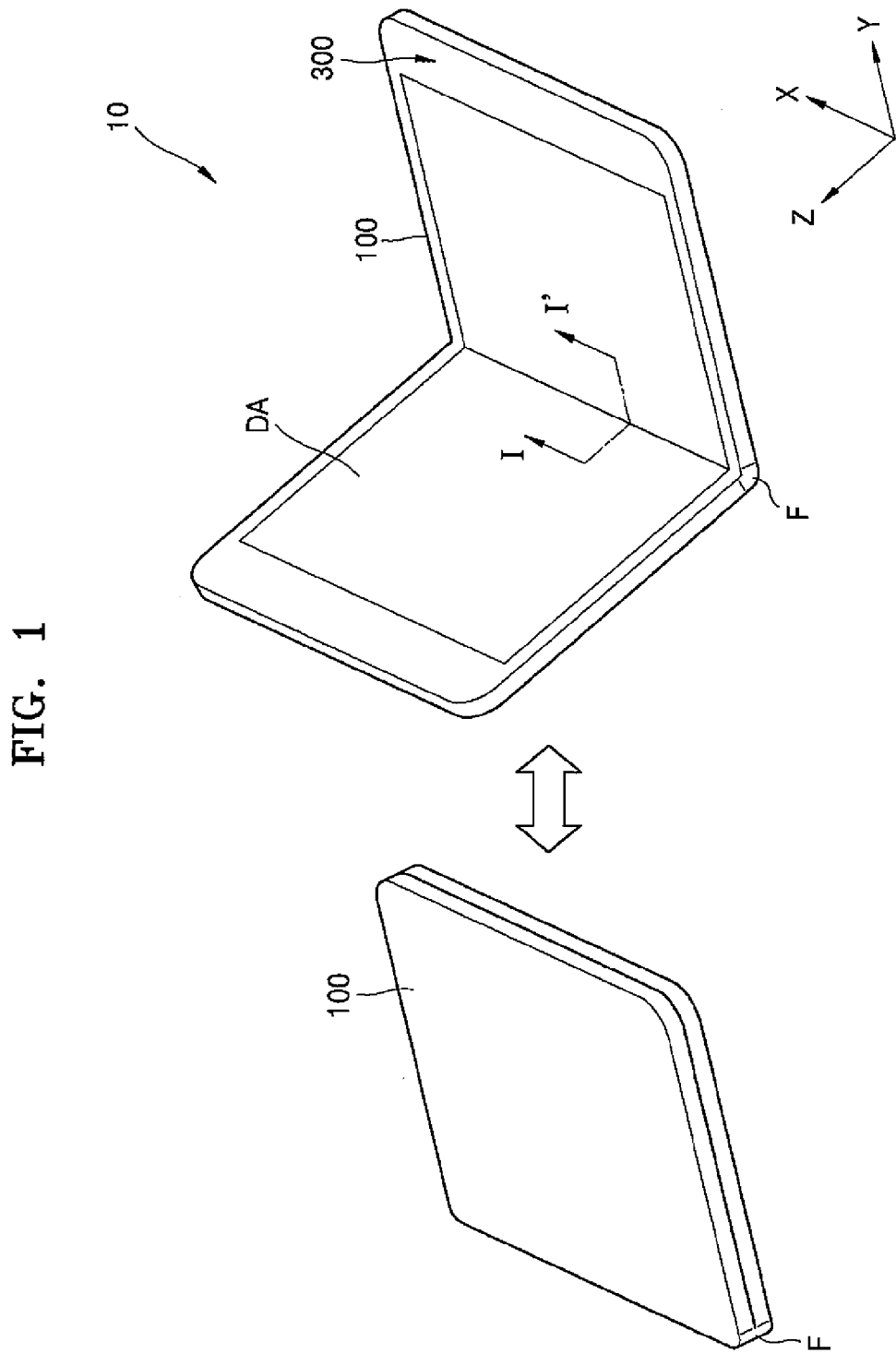
FIG. 1 is a perspective view of a flexible display device according to an example embodiment.

In the following detailed description, only certain example embodiments are shown and described, by way of illustration. However, the example embodiments are not intended to limit the present disclosure to particular modes of practice, and it is to be appreciated that all changes, equivalents, and substitutes that do not depart from the spirit and technical scope of the present disclosure are encompassed in the present disclosure. In the description of the present disclosure, certain explanations of related art are not provided when it is deemed that they may unnecessarily obscure the essence of the disclosure.

It will be understood that although the terms "first," "second," etc. may be used herein to describe various components, these components should not be limited by these terms. These terms are used to distinguish one component from another, not to limit the components.

The terminology used herein is for the purpose of describing particular embodiments and is not intended to limit the example embodiments. As used herein, the singular forms "a," "an," and "the" are intended to include the plural forms as well, and vice versa, unless the context clearly indicates otherwise. For example, although the present disclosure refers to a display unit including a display area DA, the display unit may include a plurality of display areas. Sizes of elements in the drawings may be exaggerated for convenience of explanation. In other words, since sizes and thicknesses of components in the drawings may be exaggerated or arbitrarily illustrated for convenience of explanation, the following embodiments are not limited thereto.

In the description of the components, when a component is described as being formed on or under another component, it includes cases in which the component is formed directly on or under the other component and cases in which the component is formed on or under the other component by including additional components interposed therebetween. Similarly, in the context of the present application, when a first element is referred to as being "coupled or connected to" a second element, it can be directly coupled or connected to the second element or be indirectly coupled or connected to the second element with one or more intervening elements interposed therebetween. Also, the reference of on or under will be described with respect to the drawings, but the terms on or under may interchangeable depending upon the point of view.

Reference will now be made in detail to example embodiments, examples of which are illustrated in the accompanying drawings. In the drawings, the same elements are denoted by the same reference numerals, and a repeated explanation thereof will not be given.

As used herein, the term "and/or" includes any and all combinations of one or more of the associated listed items. Expressions such as "at least one of," when preceding a list of elements, modify the entire list of elements and do not modify the individual elements of the list.

Figure 2:
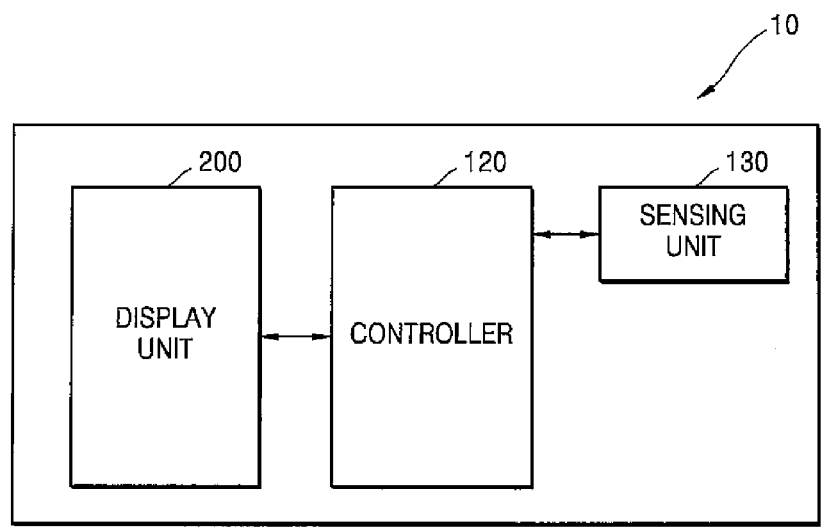
FIG. 2 is a block diagram showing a configuration of an example embodiment of the flexible display device of FIG. 1.
Figure 3:
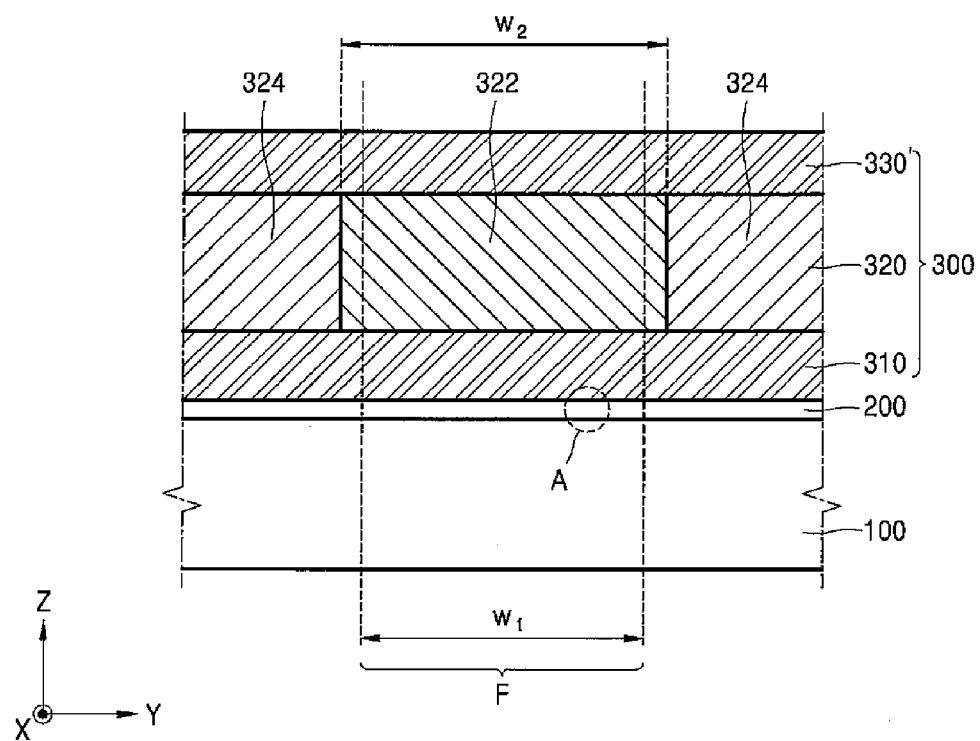
FIG. 3 is a cross-sectional view taken along a line I-I' of the flexible display device of FIG. 1 showing an example embodiment of a thin film encapsulating layer.
Figure 4:
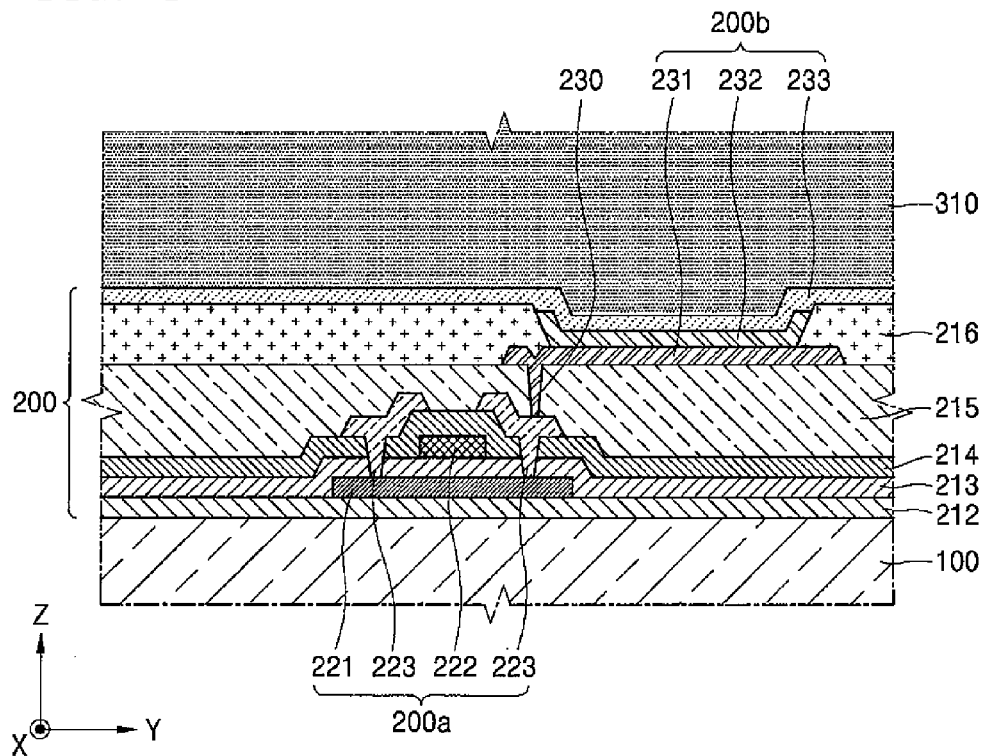
FIG. 4 is an enlarged cross-sectional view of portion A of FIG. 3.

FIG. 1 is a perspective view of a flexible display device 10 according to an example embodiment. FIG. 2 is a block diagram showing a structure (or configuration) of the flexible display device 10. FIG. 3 is a cross-sectional view of an example embodiment of a cross-sectional plane taken along a line I-I' of FIG. 1. FIG. 4 is an enlarged cross-sectional view of a portion A of FIG. 3.

The flexible display device 10 has a modifiable shape. For example, the flexible display device 10 may be folded or rolled. The flexible display device 10 may be realized as various suitable shapes (or devices), such as smart phones, tablet personal computers (PCs), notebook computers, wearable devices, electronic books, etc.

The flexible display device 10 may be transformed into a folded state or an unfolded state as shown in FIG. 1. Here, the "folded state" includes a "bent state." When the flexible display device 10 is folded at or based on a folding region F, the folded state includes not only a state in which surfaces of the flexible display device that face each other, contact (e.g., physically contact) each other, but also a state in which the surfaces that face each other are adjacent to each other, while not contacting (e.g., physically contacting) each other.

According to embodiments of the flexible display device 10, a screen may be converted according to the folded state or the unfolded state. For example, when the flexible display device 10 is in the unfolded state, an image may be realized or displayed in a display area DA. Embodiments of the flexible display device 10 may be converted from the folded state to the unfolded state and vice versa.

To this end, the flexible display device 10 may include a display unit including the display area DA, a sensing unit 130 capable of detecting a shape of the flexible display device 10, and a controller 120 capable of controlling an operation of the display unit 200, according to the shape detected by the sensing unit 130.

The display unit 200 may include, for example, an organic light-emitting device (OLED) 200b. The display unit 200 will be described in more detail later with respect to FIGS. 3 and 4.

The sensing unit 130 detects the shape of the flexible display device 10. For example, the sensing unit 130 may detect a folding operation and/or an unfolding operation of the flexible display device 10.

In some example embodiments, the sensing unit 130 may sense an operation in which the flexible display device 10 is transformed from a folded state into an unfolded state, or an operation in which the flexible display device 10 is transformed from the unfolded state to the folded state. The sensing unit 130 may have a state detecting sensor. The state detecting sensor may include at least one selected from a proximate sensor, an illuminance sensor, a magnetic sensor, a hall sensor, a touch sensor, a bending sensor, an infrared sensor, or may include a combination thereof.

In other example embodiments, the sensing unit 130 may detect whether a current state of the flexible display device 10 is an unfolded state or a folded state, and if the current state changes, the sensing unit 130 may detect a folding operation and/or an unfolding operation.

The controller 120 controls the operation of the display unit 200, according to a result of detecting via the sensing unit 130. For example, the controller 120 may block a signal and power supplied to the display unit 200, when the flexible display device 10 is in the folded state. Also, when the display unit 200 is a dual-emission type (or kind), and another screen (another display area) is realized or displayed on or via a flexible substrate 100 exposed to the outside when the flexible display device 10 is folded, the controller 120 may adjust sizes and arrangement of the screen (e.g., the other display area and/or the display area DA), according to the folded state and/or the unfolded state.

The display unit 200 may be formed on the flexible substrate 100 and may be encapsulated by a thin film encapsulating layer 300.

The flexible substrate 100 may be formed of a plastic material which has excellent thermal resistance and durability, such as polyimide, polyethylene terephthalate (PET), polycarbonate, polyethylene naphthalate, polyarylate (PAR), and polyetherimide.

The display unit 200 includes the display area DA capable of realizing an image. A pad portion may be arranged around the display area DA to transfer electrical signals from a power supply device or a signal generator to the display area DA.

The display unit 200 may include a thin film transistor (TFT) 200a and the OLED 200b. However, the present disclosure is not limited thereto. The display unit 200 may also include a liquid crystal device and/or other display devices. Hereinafter, the display unit 200 will be described in more detail with respect to FIG. 4.

A buffer layer 212 may be formed on the flexible substrate 100. The buffer layer 212 may be formed on the entire surface of the flexible substrate 100. For example, the buffer layer 212 may be formed both in the display area DA and outside the display area DA. The buffer layer 212 prevents impurity elements from penetrating into the flexible substrate 100 (or reduces a likelihood or amount of such impurity penetration), and planarizes the flexible substrate 100. The buffer 212 may be formed of various suitable materials which may planarize the substrate and protect the substrate from impurities.

For example, the buffer layer 212 may include an inorganic material, such as silicon oxide, silicon nitride, silicon oxynitride, aluminum oxide, aluminum nitride, titanium oxide, and titanium nitride, or an organic material, such as polyimide, polyester, and acryl. The buffer layer 212 may be formed as a stack of the inorganic materials or the organic materials.

The TFT 200a may be formed on the flexible substrate 100. The TFT 200a may include an active layer 221, a gate electrode 222, a source electrode 223, and a drain electrode 224.

The active layer 221 may be formed of an inorganic semiconductor, such as silicon, or an organic semiconductor. Also, the active layer 221 includes a source area, a drain area, and a channel area between the source area and the drain area. For example, when the active layer 221 is formed by using amorphous silicon, an amorphous silicon layer is formed throughout the flexible substrate 100, and the amorphous silicon layer is crystallized to form a polycrystalline silicon layer. Then, the polycrystalline silicon layer is patterned, and the source area and the drain area are doped with impurities, so that the active layer 221 including the source area, the drain area, and the channel area between the source area and the drain area, is formed.

A gate insulating layer 213 is formed on the active layer 221. The gate insulating layer 213 is to insulate the active layer 221 and the gate electrode 222 (to insulate the active layer 221 from the gate electrode 222), and may be formed of an inorganic material, such as SiNx (1<x<2: e.g., x=1.33) and $SiO_2$.

The gate electrode 222 is formed on a pre-determined (or set) area of the gate insulating layer 213. The gate electrode 222 is coupled or connected to a gate line capable of applying an on/off signal of the TFT 200a. The gate electrode 222 may include Au, Ag, Cu, Ni, Pt, Pd, Al, or Mo, and/or may include an alloy, such as Al:Nd and Mo:W. However, the gate electrode 222 is not limited thereto, and may be formed of various suitable materials in consideration of design conditions.

An interlayer insulating layer 214 formed on the gate electrode 222 is to insulate between the gate electrode 222 and the source electrode 223 (to insulate the gate electrode 222 from the source electrode 223), and to insulate between the gate electrode 222 and the drain electrode 224 (to insulate the gate electrode 222 from the drain electrode 224). The interlayer insulating layer 214 may be formed of an inorganic material, such as SiNx (1<x<2: e.g., x=1.33) and $SiO_2$.

The source electrode 223 and the drain electrode 224 are formed on the interlayer insulating layer 214. For example, the interlayer insulating layer 214 and the gate insulating layer 213 are formed so as to expose the source area and the drain area of the active layer 221, and the source electrode 223 and the drain electrode 224 are formed so as to contact the exposed source area and drain area of the active layer 221.

The source electrode 223 and the drain electrode 224 may be formed as a single layer or multiple layers (a plurality of layers), by using at least one material selected from Al, Pt, Pd, Ag, Mg, Au, Ni, Nd, Ir, Cr, Li, Ca, Mo, Ti, W, and Cu.

Meanwhile, although FIG. 4 illustrates a top gate type (or kind) of TFT 200a which sequentially includes the active layer 221, the gate electrode 222, the source electrode 223, and the drain electrode 224, the present disclosure is not limited thereto, and the gate electrode 222 may be disposed under the active layer 221.

The TFT 200a is electrically coupled or connected to the OLED 200b and applies a signal for driving the OLED 200b to the OLED 200b. The TFT 200a may be protected by being covered by a planarization layer 215.

The planarization layer 215 may be formed of an inorganic insulating layer and/or an organic insulating layer. The inorganic insulating layer may include $SiO_2$, SiNx (1<x<2: e.g., x=1.33), SiON, $Al_2O_3$, $TiO_2$, $Ta_2O_5$, $HfO_2$, $ZrO_2$, BST, or PZT, and the organic insulating layer may include polymethylmethacrylate (PMMA), polystyrene (PS), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, or a blend thereof. Also, the planarization layer 215 may be formed as a combination of the inorganic insulating layer and the organic insulating layer.

The OLED 200b may be formed on the planarization layer 215. The OLED 200b may include a pixel electrode 231, an intermediate layer 232, and an opposite electrode 233.

The pixel electrode 231 is formed on the planarization layer 215, and is electrically coupled or connected to the source electrode 223 and the drain electrode 224 via a contact hole 230 formed in the planarization layer 215.

The pixel electrode 231 may be a reflection electrode (a reflective electrode), and may include a reflective layer formed of Ag, Mg, Al, Pt, Pd, Au, Ni, Nd, Ir, Cr, or a compound (e.g., an alloy) thereof, and a transparent or half-transparent (semi-transparent) electrode layer formed on the reflective layer. The transparent or half-transparent (semi-transparent) electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The opposite electrode 233 disposed to face the pixel electrode 231 may be a transparent or half-transparent (semi-transparent) electrode, and may be formed of a metal thin film having a low work function, such as Li, Ca, LiF/Ca, LiF/Al, Al, Ag, Mg, and a compound (e.g., an alloy) thereof. Also, an auxiliary electrode layer or a bus electrode may further be formed on the metal thin film, by using a material for forming a transparent electrode, such as ITO, IZO, ZnO, and $In_2O_3$.

Accordingly, the opposite electrode 233 may transmit light emitted from an organic emission layer included in the intermediate layer 232. For example, the light emitted from the organic emission layer may be directly emitted or reflected by the pixel electrode 231 formed of the reflection electrode (reflective electrode) to be emitted to the opposite electrode 233.

However, the display unit 200 according to the present example embodiment is not limited to a top-emission type (or kind), and may also be a bottom emission type (or kind) in which the light emitted from the organic emission layer is emitted to the flexible substrate 100. In this case, the pixel electrode 231 may be formed as a transparent or a half-transparent (semi-transparent) electrode, and the opposite electrode 233 may be formed as a reflection electrode (a reflective electrode). Also, the display unit 200 according to the present example embodiment may be a dual-emission type (or kind) emitting light in both the top and bottom directions.

Meanwhile, a pixel-defining layer 216 is formed on the pixel electrode 231 by using an insulating material. The pixel-defining layer 216 may be formed of at least one organic insulating material selected from the group consisting of polyimide, polyamide, an acryl resin, benzocyclobutane, and a phenol resin, by using a spin coating method, etc. The pixel-defining layer 216 exposes a pre-determined (or set) area of the pixel electrode 231, and the intermediate layer 232 including the organic emission layer is located at or in the exposed area.

The organic emission layer included in the intermediate layer 232 may be a low molecular weight organic material or a high molecular weight organic material. Also, in addition to the organic emission layer, the intermediate layer 232 may further include function layers (functional layers), such as a hole transport layer (HTL), a hole injection layer (HIL), an electron transport layer (ETL), and an electron injection layer (EIL), selectively.

A thin film encapsulating layer 300 is disposed on the opposite electrode 233. The thin film encapsulating layer 300 is formed to cover throughout the display unit 200 to prevent external moisture or oxygen from penetrating into the display unit 200 (or to reduce a likelihood or amount of such external moisture or oxygen penetration). The thin film encapsulating layer 300 may be formed to have a greater area than the display unit 200 such that all edges of the thin film encapsulating layer 300 contact the flexible substrate 100, thereby more reliably preventing or reducing the penetration of external elements.

The thin film encapsulating layer 300 may include at least one inorganic encapsulating film 310 or 330 (e.g., a first inorganic encapsulating film 310 and/or a second inorganic encapsulating film 330), and at least one organic encapsulating film 320. The at least one inorganic encapsulating film 310 or 330, and the at least one organic encapsulating film 320 may be alternately stacked. In the embodiment shown in FIG. 3, the thin film encapsulating layer 300 includes two inorganic encapsulating films 310 and 330 (e.g., the first inorganic encapsulating film 310 and the second inorganic encapsulating film 330) and one organic encapsulating film 320. However, the present disclosure is not limited thereto. For example, the thin film encapsulating layer 300 may include a plurality of inorganic encapsulating films and a plurality of organic encapsulating films, which are alternately arranged, and the number of the inorganic encapsulating films and the organic encapsulating films is not particularly limited.

The first inorganic encapsulating film 310 and the second inorganic encapsulating film 330 may include at least one material selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The first inorganic encapsulating film 310 and the second inorganic encapsulating film 330 may each be formed to have a thickness of 5,000 Å to 10,000 Å, and may be formed to be larger than the organic encapsulating film 320 disposed between the first and second inorganic encapsulating films 310 and 330.

Also, the second inorganic encapsulating film 330 may be formed to be larger than the first inorganic encapsulating film 310 so as to directly contact the interlayer insulating layer 214 outside the display area DA. Here, the second inorganic encapsulating film 330 and the interlayer insulating layer 214 are formed of the same or substantially the same material so that adhesion between the second inorganic encapsulating film 330 and the interlayer insulating layer 214 may be improved. Thus, delamination of the second inorganic encapsulating film 330 may be prevented or reduced, and thus, penetration of external moisture or oxygen may be effectively prevented or reduced.

The organic encapsulating film 320 may be formed to have a pre-determined (or set) thickness, for example a thickness of 30,000 Å to 50,000 Å, in order to planarize a height due to the pixel-defining layer 216. The organic encapsulating film 320 may reduce stress generated in the first inorganic encapsulating film 310 and the second inorganic encapsulating film 330, and may planarize the first inorganic encapsulating film 310, on which there might be particles or defects. Meanwhile, the organic encapsulating film 320 may be formed to be smaller (e.g., to have a smaller surface area) than the first inorganic encapsulating film 310 and the second inorganic encapsulating film 330. Accordingly, the entire organic encapsulating film 320 is covered by the first inorganic encapsulating film 310 and the second inorganic encapsulating film 330 so that penetration of external moisture or oxygen may be effectively prevented or reduced.

As shown in FIG. 3, the organic encapsulating film 320 may include at least one first organic region 322 including a first organic material, and at least one second organic region 324 including a second organic material that is different from the first organic material. The first organic region 322 may extend in a first direction X, and the first organic region 322 and the second organic region 324 may be aligned (substantially aligned) with each other. Here, the first direction X refers to a direction in which a folding region F is formed, when the flexible display device 10 is folded at or in the folding region F. Thus, the first direction X is not limited to the direction illustrated in FIG. 1.

A first Young's modulus of the first organic region 322 may be different from a second Young's modulus of the second organic region 324. The Young's modulus denotes an elasticity indicating a degree of extension and transformation of an object, when the object is lengthened (or stretched) out from two directions. As the Young's modulus is increased, the organic encapsulating film 320 has a greater degree of rigidity, and adhesion and resilience may be increased. On the other hand, as the Young's modulus is decreased, the organic encapsulating film 320 may have a greater degree of elongation.

The first Young's modulus may be smaller than the second Young's modulus, and a ratio of the second Young's modulus to the first Young's modulus may be $4 \times 10$ through $2 \times 10^4$. The first organic region 322 may be formed to overlap the folding region F of the flexible display device 10. Thus, even if the flexible display device 10 is folded at or in the folding region F or is bent by a small radius of curvature, stress applied in the folding region F may be suitably or effectively distributed by the first organic region 322. Meanwhile, although FIG. 1 illustrates that the flexible display device 10 includes one folding region F, it is not limited thereto. For example, the flexible display device 10 may include two or more folding regions F spaced apart from each other, and the first organic region 322 may be present or formed in a multiple number (a plurality) to respectively correspond to a number of the two or more folding regions F.

Also, in order to suitably or effectively distribute the stress applied in the folding region F when the flexible display device 10 is folded, the first organic region 322 may have a width $W_2$ that is greater than a width $W_1$ of the folding region F. Here, the width $W_2$ of the first organic region 322 and the width $W_1$ of the folding region F denote distances measured in a second direction Y that is perpendicular (e.g., substantially perpendicular) to the first direction X. Meanwhile, when the width $W_2$ of the first organic region 322 is too great, the organic encapsulating film 320 may have a reduced adhesion, and thus, the width $W_2$ of the first organic region 322 may be formed to be equal to or less than two times the width $W_1$ of the folding region F. On the other hand, when the width $W_2$ of the first organic region 322 is too small, it is hard to suitably or effectively distribute the stress applied in the folding region F and the first organic region 322 may be formed in or at a location in which the first organic region 322 does not overlap the folding region F, due to a process margin, and thus, the width $W_2$ of the first organic region 322 may be formed to be equal to or greater than 1.2 times the width $W_1$ of the folding region F.

The first organic region 322 and the second organic region 324 may be formed by using an inkjet printing method. For example, the second organic material may be firstly inkjet-printed in or at portions except the portion in which the first organic region 322 is to be formed, and then, the first organic material may be inkjet-printed to form the first organic region 322. By this process, the first organic region 322 and the second organic region 324 may be formed such that respective side surfaces of the first organic region 322 and the second organic region 324 contact each other (e.g., physically contact each other). In other example embodiments, the first organic region 322 and the second organic region 324 may be formed in a different order (e.g., first organic material may be inkjet-printed first and the second organic material may be inkjet-printed second). Also, the first organic material and the second organic material may be concurrently or simultaneously inkjet-printed by using two heads, to concurrently or simultaneously form the first organic region 322 and the second organic region 324.

The first organic material may include a silicon-based resin, and a first Young's modulus of the first organic region 322 formed of the first organic material may be 0.001 through 0.05 Gpa. The second organic material may include at least one selected from an acryl-based resin and an epoxy-based resin, and a second Young's modulus of the second organic region 324 may be 2 through 20 Gpa.

Meanwhile, a capping layer and a protection layer may further be formed or included between the opposite electrode 233 and the thin film encapsulating layer 300.

The capping layer may be formed of an organic material, such as a-NPD, NPB, TPD, m-MTDATA, Alq3, or CuPc, and may help light generated from the OLED 200*b* be effectively emitted, while also protecting the OLED 200*b*.

A blocking layer may be formed of an inorganic material, such as LiF, MgF2, or CaF2, and may block a plasma, so that the plasma used when forming the first inorganic encapsulating film 310 does not penetrate or substantially penetrate the OLED 200*b* to cause damage to the intermediate layer 232 and the opposite electrode 233.

Figure 5:
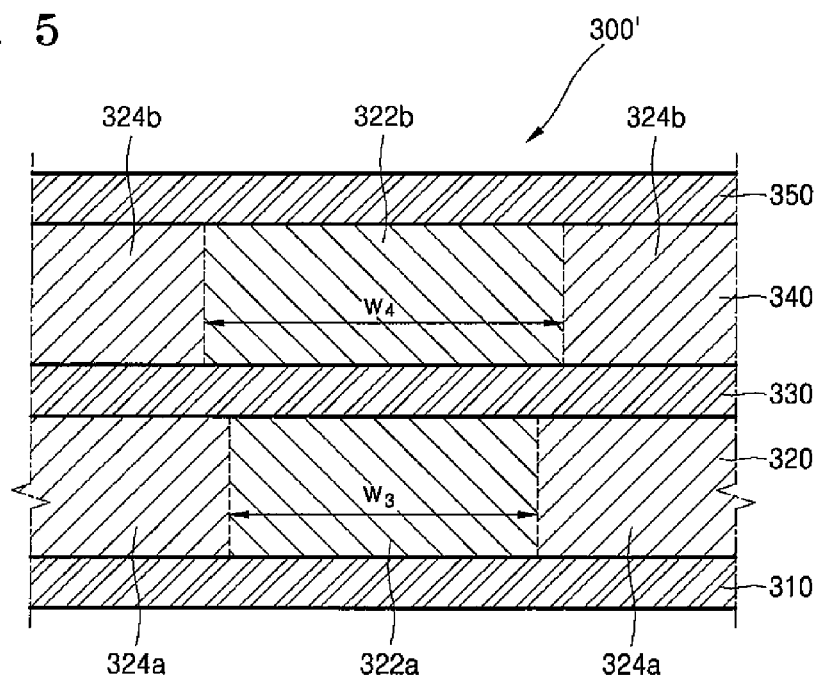
FIG. 5 is a cross-sectional view taken along the line I-I' of the flexible display device of FIG. 1 showing another example embodiment of a thin film encapsulating layer.

FIG. 5 is a cross-sectional view of an example embodiment of a thin film encapsulating layer 300' of the flexible display device 10 of FIG. 1.

Referring to FIGS. 5 and 1, the thin film encapsulating layer 300' includes three inorganic encapsulating films 310, 330, and 350 (e.g., a first inorganic encapsulating film. 310, a second inorganic encapsulating film 330, and a third inorganic encapsulating film 350), and two organic encapsulating films 320 and 340 (e.g., a first organic encapsulating film 320 and a second organic encapsulating film 340), and the inorganic encapsulating films 310, 330, and 350 and the organic encapsulating films 320 and 340 may be alternately stacked.

The first inorganic encapsulating film 310, the second inorganic encapsulating film 330, and the third inorganic encapsulating film 350 may correspond to (e.g., be the same or substantially the same as) the first and second inorganic encapsulating films 310 and 320 illustrated in FIGS. 1 through 4. For example, the first through third inorganic encapsulating films 310, 330, and 350 may include at least one material selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. Each of the first through third inorganic encapsulating films 310, 330, and 350 may be formed to have a thickness of 5,000 Å to 10,000 Å. An area of the third inorganic encapsulating film 350 may be greater than an area of the second inorganic encapsulating film 330. Also, the area of the second inorganic encapsulating film 330 may be greater than an area of the first inorganic encapsulating film 310.

The first organic encapsulating film 320 and the second organic encapsulating film 340 may correspond to (e.g., be the same or substantially the same as) the organic encapsulating film 320 illustrated in FIGS. 1 through 4. For example, an area of the first organic encapsulating film 320 may be smaller than respective areas of the first inorganic encapsulating film 310 and the second inorganic encapsulating film 330, and the first inorganic encapsulating film 310 and the second inorganic encapsulating film 330 may contact each other at or in an edge of the first organic encapsulating film 320. Likewise, the second inorganic encapsulating film 330 and the third inorganic encapsulating film 350 may contact each other at or in an edge of the second organic encapsulating film 340.

Also, the first organic encapsulating film 320 may include at least one first organic region 322a having a first Young's modulus, and at least one second organic region 324a having a second Young's modulus. The second organic encapsulating film 340 may include at least one first organic region 322b having a first Young's modulus, and at least one second organic region 324b having a second Young's modulus.

The first organic region 322a included in the first organic encapsulating film 320 and the first organic region 322b included in the second organic encapsulating film 340 may overlap the folding region F of the flexible display device 10, and a third width $W_3$ of the first organic region 322a included in the first organic encapsulating film 320 and a fourth width $W_4$ of the first organic region 322b included in the second organic encapsulating film 340 may be formed to be equal to or greater than the width of the folding region F. Thus, even if the flexible display device 10 is folded or bent by a small radius of curvature in the folding region F, stress applied in the folding region F may be suitably or effectively distributed.

Meanwhile, the second organic encapsulating film 340 arranged outside (or above) a stack structure of the thin film encapsulating layer 300' forms a wider curved surface than the first organic encapsulating film 320 disposed inside (or below) the stack structure of the thin film encapsulating layer 300', when the flexible display device 10 is bent or folded. Thus, the fourth width $W_4$ of the first organic region 322b included in the second organic encapsulating film 340 may be greater than the third width $W_3$ of the first organic region 322a included in the first organic encapsulating film 320. Accordingly, the flexible display device 10 may be smoothly folded and damage to the thin film encapsulating layer 300' may be prevented or reduced.

Likewise, when the thin film encapsulating layer 300' includes three or more organic encapsulating films, widths of first organic regions included in the organic encapsulating films may be increased in order from the organic encapsulating film disposed inside the thin film encapsulating layer 300' (e.g., the organic encapsulating film closest to the OLED 200b) to the organic encapsulating film disposed outside the thin film encapsulating layer 300' (e.g., the organic encapsulating film farthest from the OLED 200b).

Figure 6:
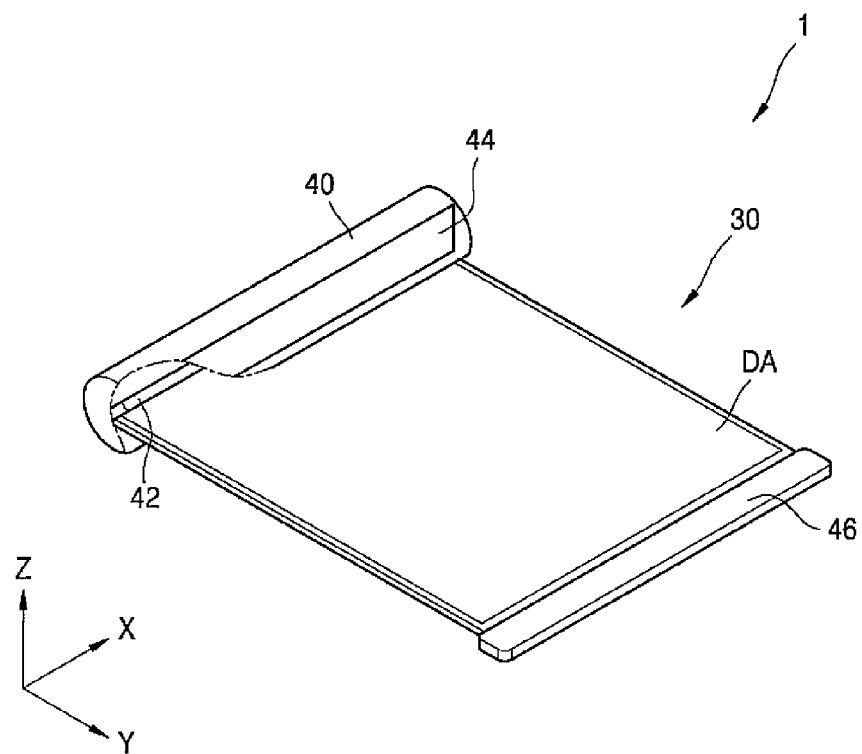
FIG. 6 is a perspective view of an electronic device, according to another example embodiment.
Figure 7:
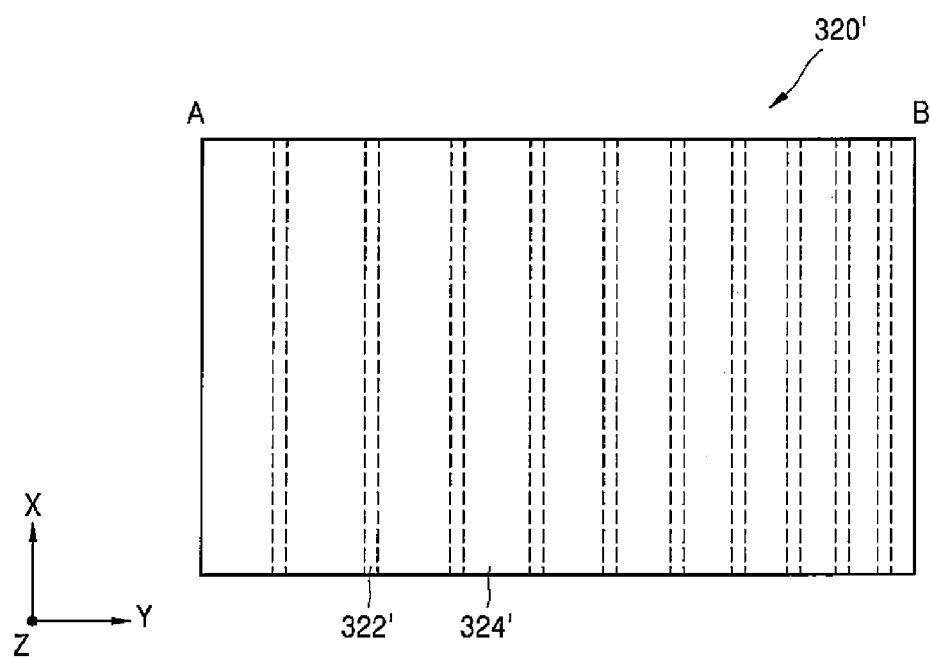
FIG. 7 is a plan view of an example embodiment of an organic encapsulating layer of a flexible display device of the electronic device of FIG. 6.

FIG. 6 is a perspective view of an electronic device 1 according to another example embodiment. FIG. 7 is a plan view of an organic encapsulating film of a flexible display device 30 included in the electronic device 1 of FIG. 6.

The electronic device 1 of FIG. 6 may include a flexible display device 30. The flexible display device 30 corresponds to the flexible display device 10 illustrated in FIGS. 1 through 4, and thus, repeated parts will not be described again here, and only the differences will be described.

The flexible display device 30 may be rolled. A side of the flexible display device 30 may be coupled to a case 40, and the other side may be coupled to a handle 46, thereby realizing the electronic device 1.

The case 40 may provide a space into which the flexible display device 30 is rolled, and may include inside thereof a rod 42 coupled to a side of the flexible display device 30. The flexible display device 30 may be wound about or around the rod 42, as a central axis, and may be unwound from the case 40. The case 40 may include an auxiliary display unit 44 exposed to the outside of the case 40. For example, the auxiliary display unit 44 may display an application selection menu, and a user may select the menu by a touch input.

The flexible display device 30 may have the same or substantially the same structure as the flexible display device 10 illustrated in FIGS. 1 through 4. For example, the flexible display device 30 may include the display unit including the display area DA, the sensing unit capable of detecting a shape of the flexible display device 30, and the controller capable of controlling the operation of the display unit according to a result of detecting via the sensing unit, and the display unit may be encapsulated by the thin film encapsulating layer. Also, the thin film encapsulating layer may include at least one inorganic encapsulating film and at least one organic encapsulating film 320'.

The organic encapsulating film 320' may include a plurality of first organic regions 322' and a plurality of second organic regions 324'. The plurality of first organic regions 322' may be formed to extend along the first direction X, and may be alternately arranged with the plurality of second organic regions 324' formed in the second direction Y that crosses the first direction X. Here, the first direction X may be a direction that is parallel (e.g., substantially parallel) to a winding axis of the flexible display device 30, through which the flexible display device 30 is rolled, and the second direction Y may be a direction perpendicular (e.g., substantially perpendicular) to the first direction X, for example, a direction in which the flexible display device 30 is unwound from the case 40.

The plurality of first organic regions 322' may each have a first Young's modulus, and the plurality of second organic regions 324' may each have a second Young's modulus that is greater than the first Young's modulus. Like this, since the plurality of first organic regions 322' having the first Young's modulus are arranged spaced apart from one another in the second direction Y, a second elongation of the organic encapsulating film 320' in the second direction Y may be greater than a first elongation of the organic encapsulating film 320' in the first direction X. For example, a first elongation percentage of the organic encapsulating film in the first direction may be smaller than a second elongation percentage of the organic encapsulating film in the second direction. Thus, stress occurring when the flexible display device 30 is rolled may be suitably or effectively distributed.

Also, gaps among the plurality of first organic regions 322' may be decreased in order from an end A of the organic encapsulating film 320' to another end B of the organic encapsulating film 320'. For example, each of the first organic regions 322' may be spaced apart from the next closest first organic region 322' by a respective one of the gaps, and the respective sizes of the gaps may decrease in order from the A end to the B end, for example, as shown in FIG. 7. Here, the end A is a side adjacent to the case 40, and the other end B is a side opposite to the end A. Like this, if the gaps among the plurality of first organic regions 322' are decreased in order from the end A to the other end B of the organic encapsulating film 320', the second elongation may become increased in order from the end A to the other end B. Accordingly, when the flexible display device 30 is rolled, stress accumulated in order from the end A to the other end B may be more suitably or effectively distributed thereby reducing or preventing damage, such as interlayer detachment, caused by the accumulated stress.

Meanwhile, the controller may control the operation of the display unit according to the shape of the flexible display device 30, which is sensed by the sensing unit. For example, the controller may realize a screen (e.g., display an image) via the display area DA, only when the flexible display device 30 is unfolded (or flat).

According to one or more of the above-described example embodiments, when the flexible display device transforms its shape, stress may be suitably or effectively distributed, and thus, the mechanical reliability of the flexible display device may be secured.

It should be understood that the example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the drawings, it will be understood by those of ordinary skill in the art that various changes in form and details may be made therein without departing from the spirit and scope of the following claims, and equivalents thereof.

What is claimed is:

1. A flexible display device comprising:
   a flexible substrate;
   a display unit on the flexible substrate and comprising a display area capable of displaying an image; and
   a thin film encapsulating layer encapsulating the display unit and comprising a first inorganic encapsulating film, an organic encapsulating film on the first inorganic encapsulating film, and a second inorganic encapsulating film on the organic encapsulating film,
   wherein the organic encapsulating film comprises at least one first organic region comprising a first organic material and at least one second organic region comprising a second organic material that is different from the first organic material, and
   a first Young's modulus of the at least one first organic region is different from a second Young's modulus of the least one second organic region.

2. The flexible display device of claim 1, wherein the first Young's modulus is smaller than the second Young's modulus, and a ratio of the second Young's modulus to the first Young's modulus is about $4\times10$ through $2\times10^4$.

3. The flexible display device of claim 1, wherein the first organic material comprises a silicon-based resin, and the second organic material comprises at least one selected from an acryl-based resin and an epoxy-based resin.

4. The flexible display device of claim 1, wherein the flexible display device comprises at least one folding region and the at least one folding region extends along a first direction, and
   the at least one first organic region overlaps the at least one folding region.

5. The flexible display device of claim 4, wherein a width of the at least one first organic region is equal to or greater than a width of the at least one folding region.

6. The flexible display device of claim 2, wherein the at least one first organic region extends in a first direction and the at least one first organic region and the at least one second organic region are alternately arranged, repeatedly, along a second direction that crosses the first direction.

7. The flexible display device of claim 6, wherein the first direction and the second direction are perpendicular to each other.

8. The flexible display device of claim 6, wherein the flexible display device is windable around an axis parallel to the first direction.

9. The flexible display device of claim 6, wherein a first elongation percentage of the organic encapsulating film in the first direction is smaller than a second elongation percentage of the organic encapsulating film in the second direction.

10. The flexible display device of claim 1, wherein the display unit comprises an organic light-emitting device (OLED) and a thin film transistor electrically coupled to the OLED.

11. A flexible display device comprising:
    a flexible substrate;
    a display unit on the flexible substrate and comprising a display area capable of displaying an image; and
    a thin film encapsulating layer encapsulating the display unit and comprising at least one inorganic encapsulating film and at least one organic encapsulating film,
    wherein the organic encapsulating film comprises at least one first organic region comprising a first organic material and at least one second organic region comprising a second organic material that is different from the first organic material,
    the at least one first organic region extends in a first direction, the at least one first organic region and the at least one second organic region are aligned with each other, and a first Young's modulus of the at least one first organic region is different from a second Young's modulus of the least one second organic region,
    wherein the first Young's modulus is smaller than the second Young's modulus, and a ratio of the second Young's modulus to the first Young's modulus is about $4\times10$ through $2\times10^4$, and
    wherein the flexible display device comprises a plurality of the inorganic encapsulating film and a plurality of the organic encapsulating film, and the inorganic encapsulating films and the organic encapsulating films are alternately stacked.

12. A flexible display device comprising:
    a display unit comprising a display area capable of displaying an image;
    a sensing unit capable of detecting a shape of the flexible display device; and
    a controller capable of controlling an operation of the display unit, according to the shape detected by the sensing unit,
    wherein the display unit is encapsulated by a thin film encapsulating layer comprising a first inorganic encapsulating film, an organic encapsulating film on the first inorganic encapsulating film, and a second inorganic encapsulating film on the organic encapsulating film,
    wherein the organic encapsulating film comprises at least one first organic region and at least one second organic region,
    side surfaces of the at least one first organic region and the at least one second organic region contact each other, and
    a first Young's modulus of the at least one first organic region and a second Young's modulus of the at least one second organic region are different from each other.

13. The flexible display device of claim 12, wherein the at least one first organic region extends in a first direction, and the first Young's modulus is smaller than the second Young's modulus.

14. The flexible display device of claim 13, wherein a ratio of the second Young's modulus to the first Young's modulus is about $4\times10$ through $2\times10^4$.

15. The flexible display device of claim 13, wherein the flexible display device comprises at least one folding region and the at least one folding region extends along the first direction, and the at least one first organic region overlaps the at least one folding region.

16. The flexible display device of claim 15, wherein the at least one folding region is located at the at least one first organic region.

17. The flexible display device of claim 13, wherein the at least one first organic region and the at least one second organic region are alternately arranged, repeatedly, along a second direction that is perpendicular to the first direction, and the flexible display device is windable around an axis parallel to the first direction.

18. The flexible display device of claim 17, wherein a first elongation percentage of the organic encapsulating film in the first direction is smaller than a second elongation percentage of the organic encapsulating film in the second direction.

19. The flexible display device of claim 13, further comprising a flexible substrate, wherein the display unit is located between the flexible substrate and the thin film encapsulating layer.

20. The flexible display device of claim 13, wherein the display unit comprises an organic light-emitting device (OLED) and a thin film transistor electrically coupled to the OLED.

* * * * *